(12) United States Patent
Shen et al.

(10) Patent No.: US 7,900,122 B2
(45) Date of Patent: Mar. 1, 2011

(54) SIMPLIFIED RS (REED-SOLOMON) CODE DECODER THAT OBVIATES ERROR VALUE POLYNOMIAL CALCULATION

(75) Inventors: Ba-Zhong Shen, Irvine, CA (US); John P. Mead, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 1022 days.

(21) Appl. No.: 11/717,469

(22) Filed: Mar. 13, 2007

(65) Prior Publication Data
US 2008/0168336 A1    Jul. 10, 2008

Related U.S. Application Data

(60) Provisional application No. 60/878,553, filed on Jan. 4, 2007, provisional application No. 60/899,522, filed on Feb. 5, 2007.

(51) Int. Cl.
*H03M 13/15*    (2006.01)
(52) U.S. Cl. ........................................ 714/784
(58) Field of Classification Search .................. 714/784
See application file for complete search history.

(56) References Cited

U.S. PATENT DOCUMENTS

| | | | | |
|---|---|---|---|---|
| 5,430,739 A * | 7/1995 | Wei et al. | | 714/784 |
| 5,889,792 A * | 3/1999 | Zhang et al. | | 714/784 |
| 6,061,826 A * | 5/2000 | Thirumoorthy et al. | | 714/784 |
| 6,081,920 A * | 6/2000 | Morelos-Zaragoza | | 714/785 |
| 6,122,766 A * | 9/2000 | Fukuoka et al. | | 714/784 |
| 6,487,692 B1 * | 11/2002 | Morelos-Zaragoza | | 714/784 |
| 6,553,537 B1 * | 4/2003 | Fukuoka | | 714/784 |
| 7,096,408 B1 * | 8/2006 | Ireland et al. | | 714/784 |
| 7,590,923 B1 * | 9/2009 | Kikuchi et al. | | 714/780 |
| 7,716,562 B1 * | 5/2010 | Wu et al. | | 714/784 |
| 7,757,156 B2 * | 7/2010 | Jung et al. | | 714/784 |
| 7,793,195 B1 * | 9/2010 | Wu | | 714/781 |
| 7,805,662 B2 * | 9/2010 | Ma et al. | | 714/784 |

* cited by examiner

*Primary Examiner* — Stephen M Baker
(74) *Attorney, Agent, or Firm* — Garlick Harrison & Markison; Shayne X. Short

(57) ABSTRACT

Simplified RS (Reed-Solomon) code decoder that obviates error value polynomial calculation. A novel means is presented herein by which error magnitudes (or error values) can be calculated directly without requiring the generation of an error value polynomial (EVP). Modification of the Koetter decoding approach and the Forney formula are employed herein to perform the direct calculation of the error values. This approach is operable to save computation clock cycles that would normally be used to compute the EVP, and these clock cycles may be used to reduce the otherwise required parallelism and complexity in the ECC design that may be needed to perform the error correction in the allotted time and may also result in power savings. Some advantages related to this may approach include lower risk, less design time, and more scalability in an overall design.

20 Claims, 9 Drawing Sheets

SIMPLIFIED RS (REED-SOLOMON) CODE DECODER THAT OBVIATES ERROR VALUE POLYNOMIAL CALCULATION

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Applications which are hereby incorporated herein by reference in their entirety and made part of the present U.S. Utility patent application for all purposes:

1. U.S. Provisional Application Ser. No. 60/878,553, entitled "Area efficient on-the-fly error correction code (ECC) decoder architecture," filed Jan. 4, 2007.

2. U.S. Provisional Application Ser. No. 60/899,522, entitled "Simplified RS (Reed-Solomon) code decoder that obviates error value polynomial calculation," filed Feb. 5, 2007.

INCORPORATION BY REFERENCE

The following U.S. Utility patent application is hereby incorporated herein by reference in its entirety and is made part of the present U.S. Utility patent application for all purposes:

1. U.S. Utility patent application Ser. No. 11/717,468, entitled "Area efficient on-the-fly error correction code (ECC) decoder architecture," filed concurrently on Mar. 13, 2007, pending.

BACKGROUND OF THE INVENTION

1. Technical Field of the Invention

The invention relates generally to communication systems; and, more particularly, it relates to communication systems employing Reed-Solomon (RS) coding.

2. Description of Related Art

Data communication systems have been under continual development for many years. One such type of communication system that has been of significant interest lately is a communication system that employs iterative error correction codes. One type of communication system that has received interest in recent years has been one which employs Reed-Solomon (RS) codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

There are a wide variety of applications in which RS codes can be employed to attempt to effectuate (ideally) error free transmission and receipt of information. In the context of communication systems having a communication channel over which coded signals are communicated, RS codes can be employed to attempt to effectuate (ideally) error free transmission from a communication device and/or (ideally) error free receipt of information to a communication device. In the context of hard disk drive (HDD) applications, RS codes can be employed to attempt to effectuate (ideally) error free write and/or read of information to and from storage media. With respect to HDD applications, as is known, many varieties of memory storage devices (e.g. disk drives), such as magnetic disk drives are used to provide data storage for a host device, either directly, or through a network such as a storage area network (SAN) or network attached storage (NAS). Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

One of the operations performed in prior art decoding of a RS coded signal is the generation of an error value polynomial (EVP). Prior art RS decoding approaches necessarily require the computing the EVP. For large error correction code (ECC) systems (e.g., t=120), this can take anywhere from 1000 to 7000 clock cycles depending on the amount of ALU parallelism is provided in the decoding device. Additionally, computing the EVP typically requires some additional MUXing which may significantly affects area and speed of design in silicon when implementing an actual communication device capable to perform decoding of a RS coded signal.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach is presented herein that is operable to save computation clock cycles that would normally be used to compute the error value polynomial (EVP) to be used in Forney's algorithm for computing error values when decoding a Reed-Solomon (RS) coded signal. These clock cycles may be used to reduce the otherwise required parallelism and complexity in the ECC design that may be needed to perform the error correction in the allotted time. Moreover, this reduction in clock cycles may also result in power savings. The typically large hardware costs required to perform multiplexing of signals needed when computing the EVP in accordance with RS decoding are largely avoided. The approach presented herein provides for a much lesser complex solution for decoding RS coded signals. Some advantages related to this may approach include lower risk, less design time, and more scalability in an overall design.

Figure 1:
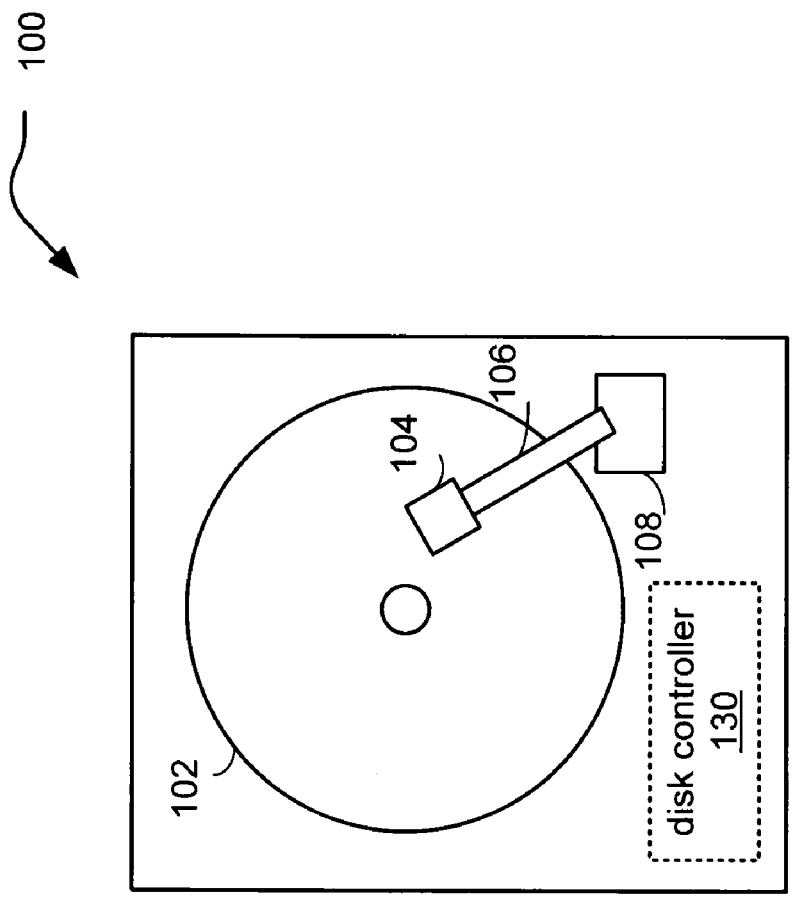
FIG. 1 illustrates an embodiment of a disk drive unit.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
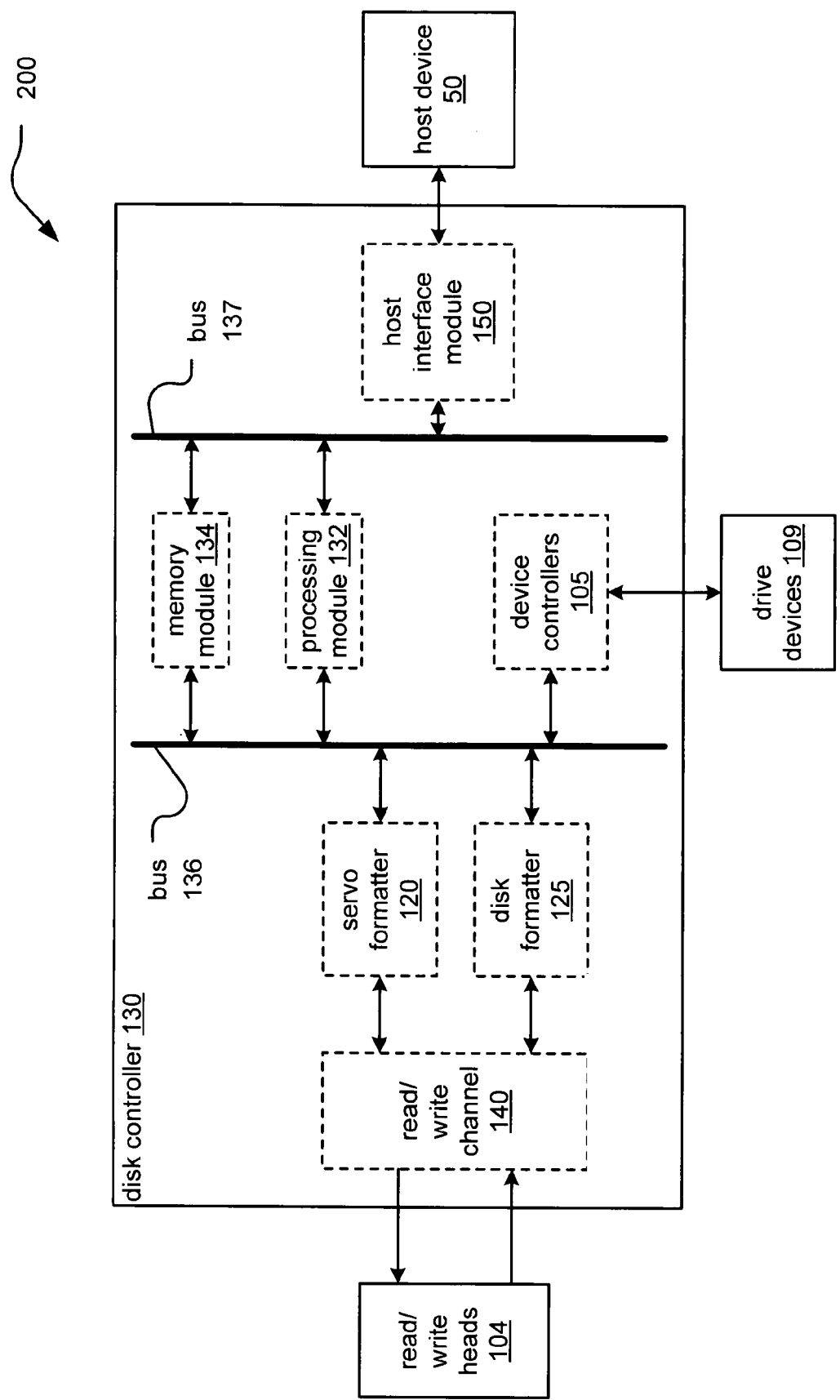
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50. Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

Figure 3:
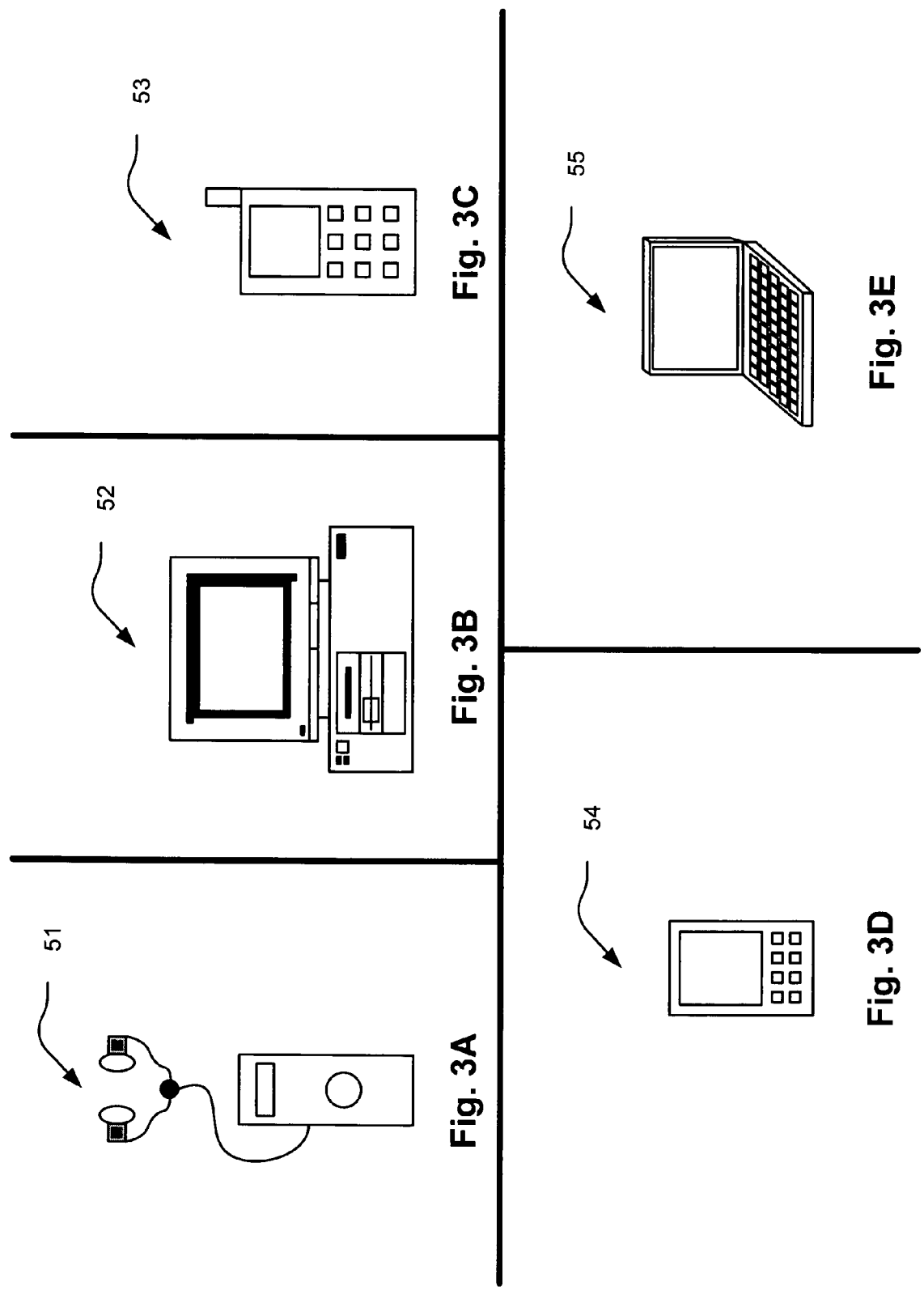
FIG. 3A illustrates an embodiment of a handheld audio unit.
FIG. 3B illustrates an embodiment of a computer.
FIG. 3C illustrates an embodiment of a wireless communication device.
FIG. 3D illustrates an embodiment of a personal digital assistant (PDA).
FIG. 3E illustrates an embodiment of a laptop computer.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3)

files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk unit 100 whose disk 102 has a diameter 1.8" or smaller, or a 2.5" drive. Disk drive 100 is incorporated into or otherwise used by laptop computer 52 to provide general purpose storage for any type of information in digital format.

Figure 4:
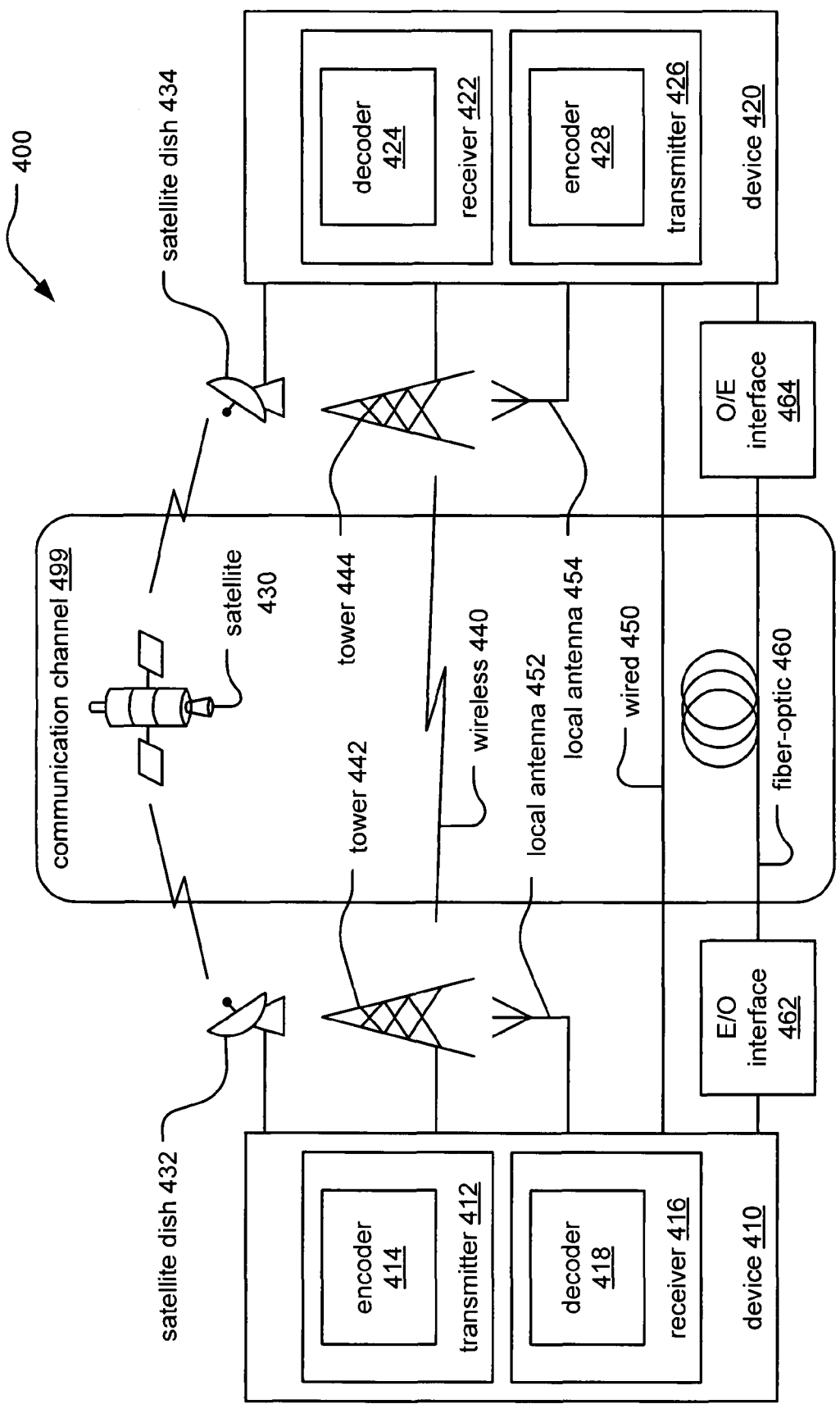
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (O/E) interface 464)). In addition, more than one type of media may be implemented and interfaced together thereby forming the communication channel 499.

The signals employed within this embodiment of a communication system 400 can be Reed-Solomon (RS) coded signals. Any of a very wide variety of applications that employ RS coding can benefit from various aspects of the invention, including any of those types of communication systems depicted in FIG. 4. Moreover, other types of devices and applications (e.g., including those employ some type of HDD) that employ RS coding can also benefit from various aspects of the invention.

Figure 5:
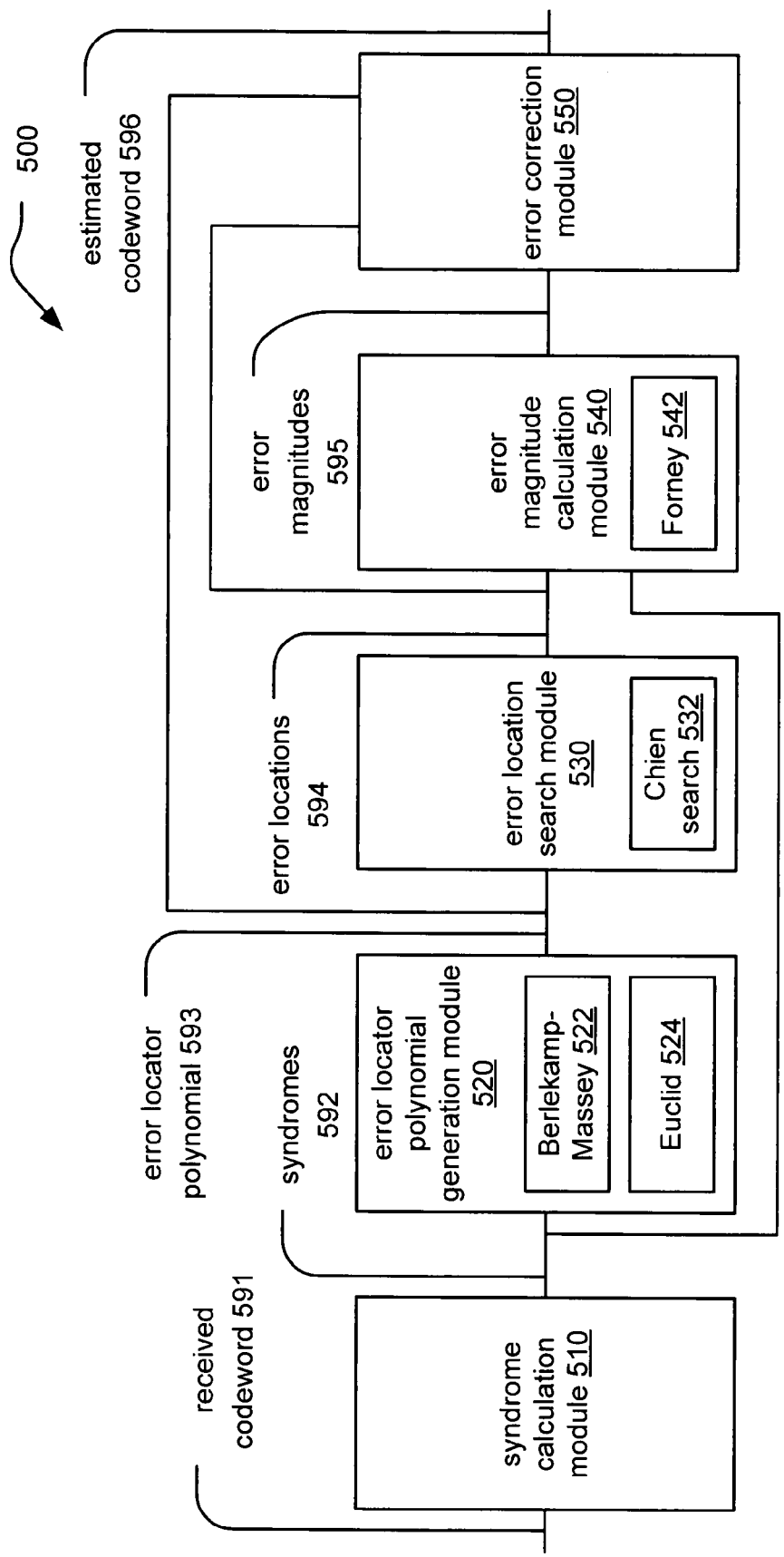
FIG. 5 illustrates an embodiment of a Reed-Solomon (RS) decoder.

FIG. 5 illustrates an embodiment of a Reed-Solomon (RS) decoder 500. This is a general depiction of an architecture of a RS decoder 500, and it is noted that variations and/or modifications thereof may be performed without departing from the scope and spirit of the invention. At a minimum, the RS decoder includes an error locator polynomial generation module 520 and an error location search module 530.

A corresponding RS encoder (not shown in this particular embodiment) takes data (e.g., a block of digital data) and adds redundancy or parity bits thereto thereby generating a codeword (e.g., a codeword to be written, transmitted, and/or launched into a communication channel). This redundancy is generated as a function of the particular RS code employed. Therefore, when the data (after undergoing RS encoding) is provided to some storage media (and/or transmitted via a communication channel and/or launched into a communication channel), and after it is read there from (or received there from), in the undesirable event that any errors occurred during either of these processes (write and/or read or transmit and/or receive), hopefully the number of errors incurred is less than the error correcting capability of the RS code. The number and types of errors that can be corrected depends on the particular characteristics of the RS code employed.

Looking at FIG. 5, a received codeword 591 can be viewed as being the originally transmitted (or written) codeword plus any errors that have been incurred during the write and/or read processes to the media or during the transmission and/or receipt of a RS coded signal. In addition, such as in the context of HDD applications, perhaps some defects occurred to the actual physical surface of the storage media after the codeword has been written. This received codeword would then also include those incurred errors as well. Generally speaking, the RS decoder 500 attempts to identify the locations and magnitudes of any errors within the received codeword 591 (up to the error correcting capability of the RS code) and to correct those errors.

A syndrome calculation module 510 then processes the received codeword 591 to generate syndromes 592. The operation of the syndrome calculation module 510 is analogous and similar to the calculation of the redundancy or parity bits within the RS encoding processing. As a function of the RS code employed, a RS codeword has a predetermined number of syndromes that depend only on errors (i.e., not on the actually written or transmitted codeword). The syndromes can be calculated by substituting a predetermined number of roots (as determined by the RS code) of the generator polynomial (employed within RS encoding) into the received codeword 591.

An error locator polynomial generation module 520 then receives these calculated syndromes 592. The syndromes 592 are also passed to an error magnitude calculation module 540. The error locator polynomial generation module 520 can generate the error locator polynomial 593 using various means, two of which can include the Berlekamp-Massey method 522 or Euclid method 524.

The error locator polynomial 593 is provided to an error correction module 550. The error locator polynomial 593 is also provided to an error location search module 530 that is operable to solve for the roots of the error locator polynomial 593. One approach is to employ the Chien search function 532.

Once the error locations 594 have been found within the error location search module 530 (i.e., using the Chien search function 532), then the error locations 594 are provided to the error magnitude calculation module 540 as well as to the error correction module 550. The error magnitude calculation module 540 finds the symbol error values, and it can employ a known approach such as the Forney method 542. Once the error locations 594 and the error magnitudes 595 are known, then the error correction module 550 corrects for them and outputs an estimated codeword 596.

With respect to the various processing modules depicted in this diagram as well as others, it is noted that any such processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Any such processing module can also be coupled to a memory. Such a memory may be a single memory device or a plurality of memory devices. Such a memory device may be a read-only memory, random access memory, volatile memory, non-volatile memory, static memory, dynamic memory, flash memory, and/or any device that stores digital information. Note that when such a processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated herein. Alternatively, it is noted that such a processing module may include an embedded memory (or memories) that is operable to assist in the operations analogous to an external memory as described above.

Figure 6:
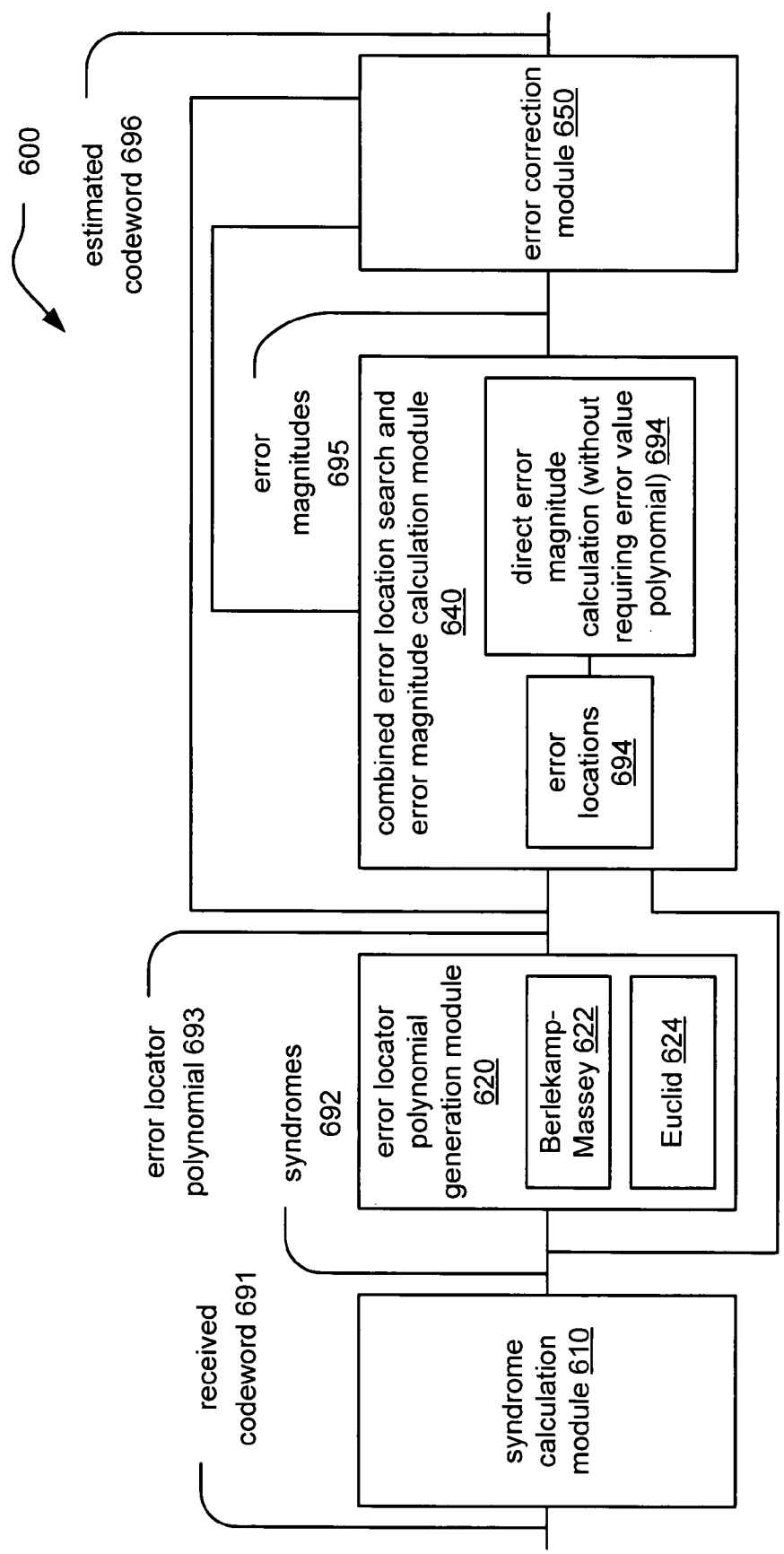
FIG. 6 illustrates an embodiment of a RS decoder that obviates the need to calculate the error value polynomial (EVP).

FIG. 6 illustrates an embodiment of a RS decoder that obviates the need to calculate the error value polynomial (EVP). This embodiment has some similarities to the previous embodiment, but there is no need to perform calculation of the error value polynomial (EVP) in this embodiment.

In this embodiment as well, a corresponding RS encoder (not shown in this particular embodiment) takes data (e.g., a block of digital data) and adds redundancy or parity bits thereto thereby generating a codeword (e.g., a codeword to be written, transmitted, and/or launched into a communication channel). This redundancy is generated as a function of the particular RS code employed. Therefore, when the data (after undergoing RS encoding) is provided to some storage media (and/or transmitted via a communication channel and/or launched into a communication channel), and after it is read there from (or received there from), in the undesirable event that any errors occurred during either of these processes (write and/or read or transmit and/or receive), hopefully the number of errors incurred is less than the error correcting capability of the RS code. The number and types of errors that can be corrected depends on the particular characteristics of the RS code employed.

Looking at FIG. 6, a received codeword 691 can be viewed as being the originally transmitted (or written) codeword plus any errors that have been incurred during the write and/or read processes to the media or during the transmission and/or receipt of a RS coded signal. In addition, such as in the context of HDD applications, perhaps some defects occurred to the actual physical surface of the storage media after the codeword has been written. This received codeword would then also include those incurred errors as well. Generally speaking, the RS decoder 600 attempts to identify the locations and magnitudes of any errors within the received codeword 691 (up to the error correcting capability of the RS code) and to correct those errors.

A syndrome calculation module 610 then processes the received codeword 691 to generate syndromes 692. The operation of the syndrome calculation module 610 is analogous and similar to the calculation of the redundancy or parity bits within the RS encoding processing. As a function of the RS code employed, a RS codeword has a predetermined number of syndromes that depend only on errors (i.e., not on the actually written or transmitted codeword). The syndromes can be calculated by substituting a predetermined number of roots (as determined by the RS code) of the generator polynomial (employed within RS encoding) into the received codeword 691.

An error locator polynomial generation module 620 then receives these calculated syndromes 692. The syndromes 692 are also passed to an error magnitude calculation module 640. The error locator polynomial generation module 620 can generate the error locator polynomial 693 using various means, two of which can include the Berlekamp-Massey method 622 or Euclid method 624.

The error locator polynomial 693 is provided to a combined error location search and error magnitude calculation module 640. This combined error location search and error magnitude calculation module 640 is operable to locate any errors within the error locator polynomial 693 (i.e., solve for the roots of the error locator polynomial 693 to identify any error locations 692, if existent). One approach is to employ the Chien search function.

Once the error locations have been found within the combined error location search and error magnitude calculation module 640 (e.g., using the Chien search function or some other search function), then the error locations 694 are employed also by the combined error location search and error magnitude calculation module 640 to perform calculation of any error values (or error magnitudes 695). There is no need to perform the calculation of the EVP in this embodiment, as the combined error location search and error magnitude calculation module 640 is operable to perform calculation of the error values directly without requiring or using an EVP. Once the error locations 694 and the error magnitudes 695 are known, then the error correction module 650 corrects for them and outputs an estimated codeword 696.

In order to implement the suggested modified version of the Koetter theorem for computing ECC error values with a conventional Berlekamp-Massey hardware implementation, some minor changes must first be made to the Berlekamp-Massey algorithm (BMA). Once this is accomplished, an error value computation can be performed by simply executing a three-way Galois field multiply followed by a Galois field inversion at each error location during the Chien search operation. The modifications to Berlekamp-Massey and the additional hardware requirements for executing the modified Koetter Theorem for value computations are described below.

The following equation taken from reference [1] defines the error value computation that must be performed following each location of the Chien search in which the ELP ($\sigma(x)$) evaluates to zero.

$$e_i = \left( \frac{1}{\alpha^{(2v-1)i} \lambda(\alpha^{-i})[\alpha^{-i}\sigma'(\alpha^{-i})]} \right)$$

In this equation, "i" is the error location beginning with zero as the last ECC parity check symbol and ending with the first data symbol, $\alpha$ is an element of the Galois field (GF), and "v" is the degree of the "complete" ELP. To describe this equation in more practical terms, it is broken apart even further below:

$$e_i = \left( \frac{1}{\alpha^{(2v-1)i} \lambda(\alpha^{-i})[\alpha^{-i}\sigma'(\alpha^{-i})]} \right)$$

$$= \left( \frac{1}{\alpha^{(2v-1)i}\left(\frac{\sigma_p(\alpha^{-i})}{\Delta_p}\right)[\sigma_{c(odd)}(\alpha^{-i})]} \right), \text{ where}$$

$$\lambda(\alpha^{-i}) = \frac{\sigma_p(\alpha^{-i})}{\Delta_p}, \text{ and}$$

$$\alpha^{-i}\sigma'(\alpha^{-i}) = \sigma_{c(odd)}(\alpha^{-i}).$$

In this breakdown, introduce some additional symbolic terms to represent hardware register values stored during the Berlekamp-Massey processing in one implementation. These new symbols are defined below:

$\sigma_c$: the "current" sigma register. This is the working sigma storage register and the coefficients of the "complete" error location polynomial at the end of the Berlekamp-Massey processing.

$\sigma_{c(odd)}$: the odd terms of the "current" sigma register. During the error location search operation (e.g., Chien search operation) the term $\tau_{c(odd)}(\alpha^{-1})$ is used to signify the odd terms of the error location polynomial evaluated at $\alpha^{-1}$, where "i" is the error location as defined above.

$\sigma_p$: the "previous" sigma register. This is the value of sigma at the previous degree of the error location polynomial, after being appropriately shifted. During the error location search operation (e.g., Chien search operation) the term up $\sigma_p(\alpha^{-1})$ is used to signify the next-to-last degree of the error location polynomial evaluated at $\alpha^{-1}$.

$\Delta_p$: the discrepancy of the previous sigma. This is the discrepancy of the error location polynomial at the next-to-last degree of the error location polynomial.

By changing the positions of the terms of the above equations, the following modified equation for calculating error value, $e_i$, can be produced:

$$e_i = \left( \frac{1}{\left(\frac{\alpha^{(2v-1)i}}{\Delta_p}\right)(\sigma_p(\alpha^{-i}))[\sigma_{c(odd)}(\alpha^{-i})]} \right)$$

In one implementation of the Berlekamp-Massey algorithm (BMA) as employed to decode a RS coded signal, one bank of (t) symbol-wide registers is used to store the coefficients of $\sigma_c(x)$ and another is used to store the coefficients of $\sigma_p(x)$. In addition, the current discrepancy ($\Delta_c$) is computed each iteration and (when non-zero) an inverted version is calculated for use when the degree of the error location polynomial (ELP) is updated next, at which time it becomes known as $1/\Delta_p$. Then, for each iteration for which the discrepancy of the previous iteration was non-zero, the discrepancy ratio ($\Delta_c/\Delta_p$) is computed by multiplying $\Delta_c$ by $1/\Delta_p$, and used when calculating the new $\sigma_c(x)$.

Figure 7:
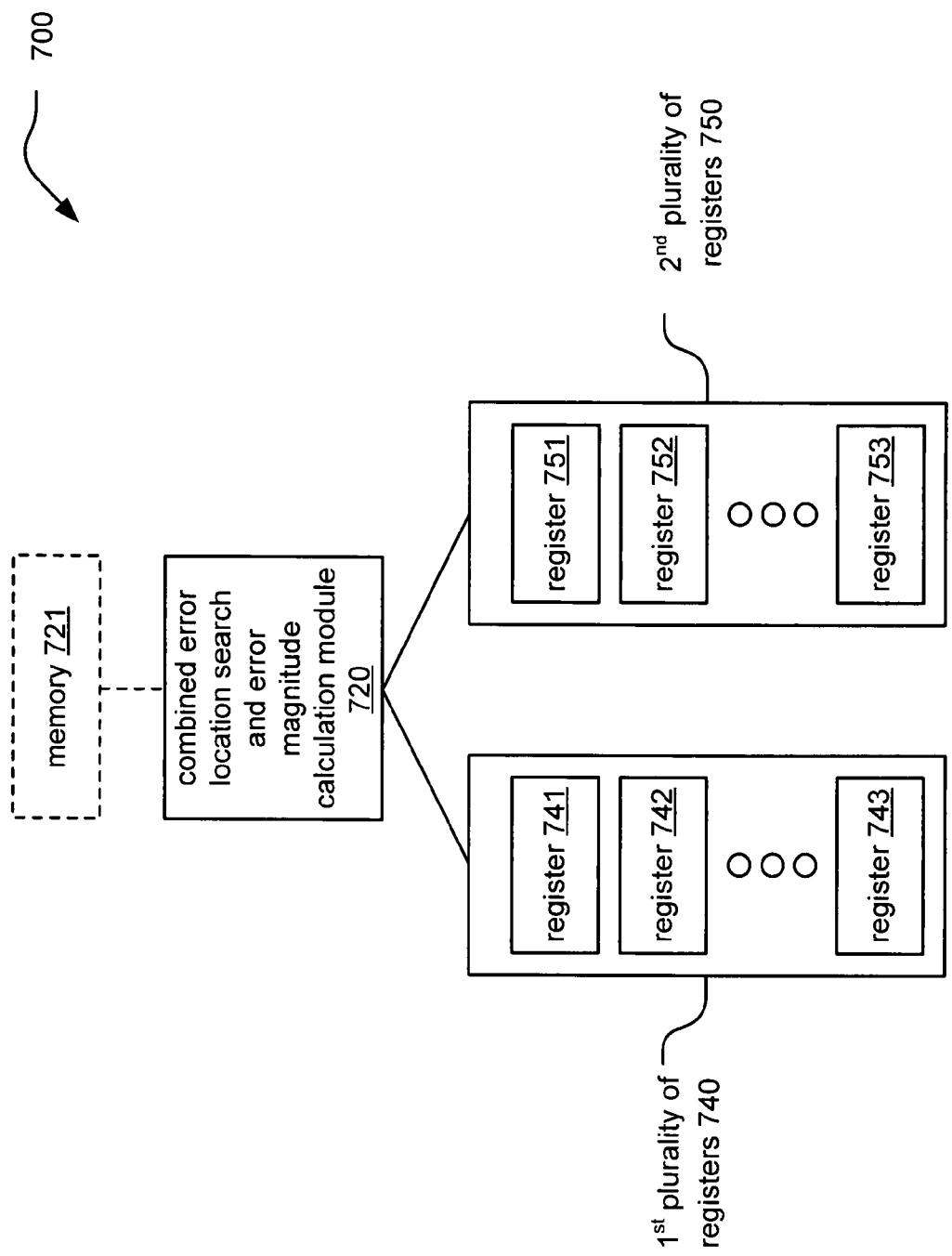
FIG. 7 illustrates an embodiment of combined error location search and error magnitude calculation being performed using only 2 banks of registers in accordance with decoding of a RS coded signal.

FIG. 7 illustrates an embodiment of combined error location search and error magnitude calculation 700 being performed using only 2 banks of registers in accordance with decoding of a RS coded signal. As described above, one bank of (t) symbol-wide registers is used to store the coefficients of $\sigma_c(x)$ and another is used to store the coefficients of $\sigma_p(x)$. In this embodiment, a combined error location search and error magnitude calculation module 720 is operable to performing searching of the error locations as well as perform direct calculation of any error values in accordance with RS decoding. The combined error location search and error magnitude calculation module 720 can be coupled to a memory 721 to assist in the operations required to perform its particular functions as described above with respect to other embodiments.

As can be seen, a first plurality of registers 740 (as shown by register 741, register 742, . . . , and register 743) and a second plurality of registers 750 (as shown by register 751, register 752, . . . , and register 753) are required for use in storing the coefficients of $\sigma_c(x)$ and the coefficients of $\sigma_p(x)$ are employed during the searching for error locations and calculation of any error values. In some desired embodiments, each of the first plurality of registers 740 and a second plurality of registers 750 includes a same number of registers; each has the same number of registers.

The purpose for shifting $\sigma_p$ in this variant to the Berlekamp-Massey decoding approach is to account for the $X^{c-p}$ product in the classical $\sigma_c$ computation (e.g., where c is the iteration counter that corresponds to the current iteration, and p corresponds to the previous iteration). When using this variant of the Berlekamp-Massey decoding approach, care must be now taken to ensure that $\sigma_p$ is only shifted after iterations with non-zero discrepancies. And, when (one or more) intermediate zero discrepancies, is discovered followed by a non-zero discrepancy, multiple shifts in $\sigma_p$ must be performed at that time to account for the intermediate zero discrepancies that occurred.

Another alteration to Berlekamp-Massey decoding approach is the compilation of the term $\alpha^{(2v-1)}$ that to be used to generate the complete term, $(\alpha^{(2v-1)\cdot i}/\Delta_p)$, from the modified equation for calculating error value, $e_i$, shown above. This can be accomplished during the Berlekamp-Massey algorithm using the circuit in the upper portion of the FIG. 8.

Figure 8:
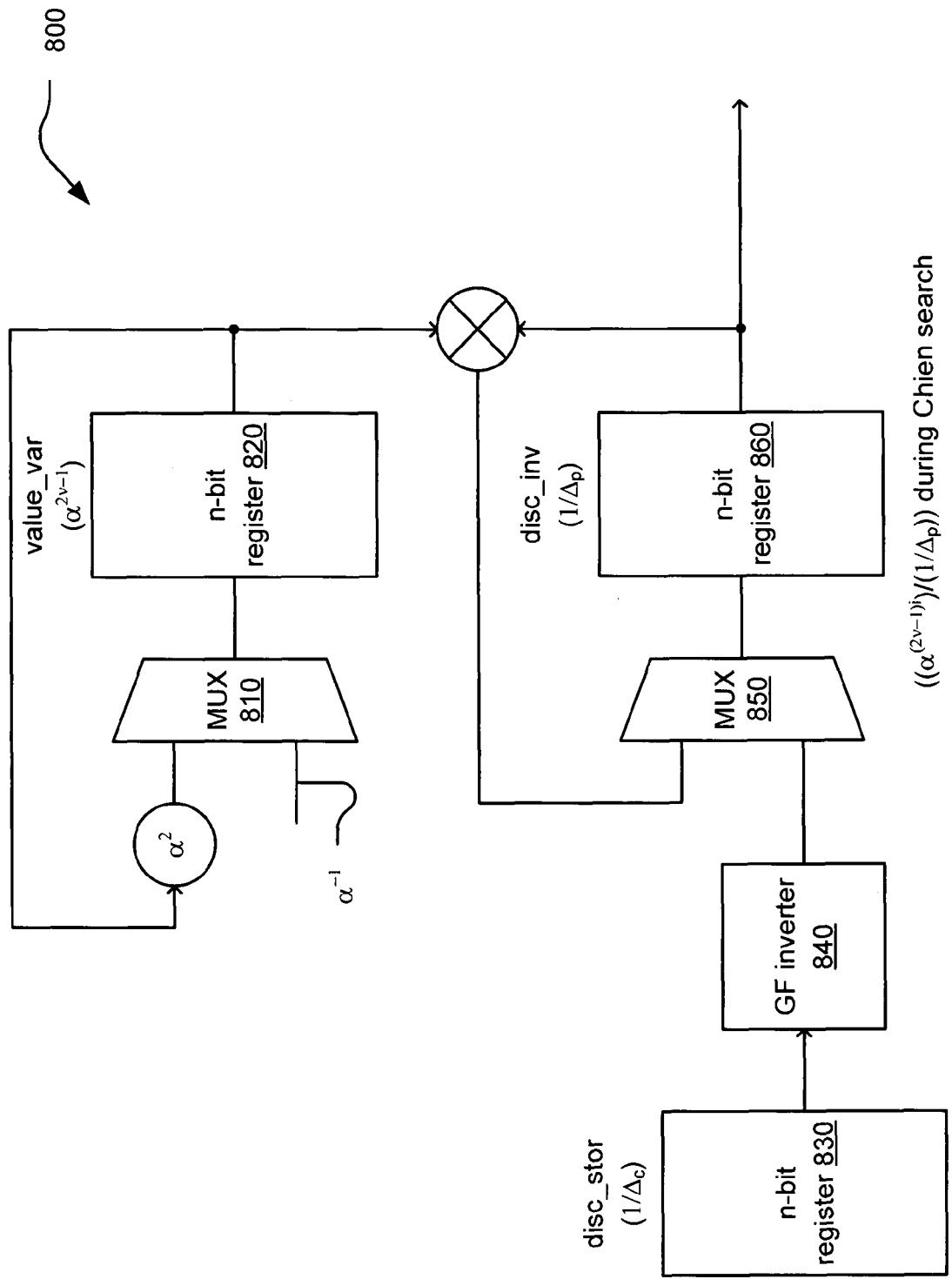
FIG. 8 illustrates an embodiment of a portion of RS decoder that obviates the need to calculate the EVP.

FIG. 8 illustrates an embodiment of a portion 800 of RS decoder that obviates the need to calculate the EVP. As can be seen when considering the circuit in the upper portion of the FIG. 8, this circuit initializes the value_var register (shown as an n-bit register 820, where n is the symbol size in bits) to $\alpha^{-1}$ during initialization of the decoding processing (as can be seen by being provided via MUX 810). Then, each time the degree of the error location polynomial (ELP) is updated, the result of the register 820 is multiplied by $\alpha^2$. This way, the value stored in the value_var register 820 is equal to $\alpha^{(2v-1)}$ at the end of the Berlekamp-Massey decoding processing.

The completion of the term, $(\alpha^{(2v-1)\cdot i}/\Delta_p)$, is initially calculated and updated during each search cycle of the Chien search. This is accomplished using the hardware shown on the lower portion of FIG. 8. Most of this logic is already required for the Berlekamp-Massey decoding processing. At the start of the Chien search, the disc_inv register (shown as an n-bit register 860, where n is again is the symbol size in bits) holds the value $1/\Delta_p$, as described above. Then, for each search cycle of the Chien search, the value stored in this register is loaded with its previous value multiplied by $\alpha^{(2v-1)}$, which is provided from the value_var register (i.e., the register 820). This results in the required term, $(\alpha^{(2v-1)\cdot i}/\Delta_p)$, being provided for each location of the search. The multiplier used to calculate this result is available and can be reused from the Berlekamp-Massey hardware.

Another register 830 is operable to store the inverted discrepancy (shown as a disc_stor register). A Galois Field (GF) inverter 840 is operable to generate the inverted discrepancy. To complete the error value computation (i.e., calculation of the error value, $e_i$), the three terms in the denominator of the equation above are multiplied together and the result is inverted using Galois Field arithmetic. The modified equation for calculating the error value, $e_i$, is provided here again for the ease of the reader:

$$e_i = \left( \frac{1}{\left(\frac{\alpha^{(2v-1)i}}{\Delta_p}\right)(\sigma_p(\alpha^{-i}))[\sigma_{c(odd)}(\alpha^{-i})]} \right).$$

As can be seen, the embodiment of the FIG. 8 is operable to calculate the first term (i.e., $\alpha^{(2v-1)\cdot i}/\Delta_p$) in this denominator. The other two terms of the denominator (i.e., $(\sigma_p(\alpha^{-i}))$ and $[\sigma_{c(odd)}(\alpha^{-i})]$) are determined by evaluation of the current and previous ELPs at the error locations; these values are readily available any time an error location is found. As can also be seen, much of this hardware is employed during the searching for error locations within the error location polynomial (ELP). This is truly a combined approach in which searching for error locations and direct calculation of error values is performed within a single decoding architecture that is operable to perform decoding of a RS coded signal.

Additional information is provided below to assist the reader in understanding the means by which calculation of the error value polynomial (EVP) can be obviated when decoding a RS coded signal.

In reference [1], Koetter developed an error value computation method for algebraic geometric codes that saves hardware or latency. However, the method in reference [1] cannot be directly used in a typical Reed-Solomon (RS) decoder using the Berlekamp-Massey algorithm (BMA) for decoding processing (i.e., see references [2, 3]) and the Chien search as employed within decoding of a RS coded signal. Herein, the approach of reference [1] is modified to allow for decoding of a RS coded signal in an approach in which the calculation of the error value polynomial (EVP) is obviated.

Syndrome Calculation and Error-Locator

Let $g(x)=(x-\alpha^L)(x-\alpha^{L+1}) \ldots (x-\alpha^{L+2t-1})$ be a generator polynomial of a t error correction m-bit symbol Reed-Solomon (RS) code of length n, where $\alpha$ is a primitive element of a Galois Field, i.e., $GF(2^m)$, and L is an integer (e.g., such as L=0 if desired in one embodiment). Let the received vector $r=c+e$, where c is a received codeword and $e=(e_0, \ldots, e_{n-1})$ is an error vector. Then the syndrome of the received vector, r, is defined as follows:

$$S_j = \sum_{i=0}^{n-1} r_i \alpha^{i(L+j)} = \sum_{i=0}^{n-1} e_i \alpha^{i(L+j)}, \, j = 0, \ldots, 2t-1 \quad (EQ\ 1)$$

Let $v \leq t$ and suppose e have v non-zero error locations, e.g., $e_{i_1}, \ldots, e_{i_v}$. Then the error location polynomial, $\sigma(x)$, is defined as follows:

$$\sigma(x) = \sum_{k=0}^{v} \sigma_k x^k = (1 - \alpha^{i_1} x)(1 - \alpha^{i_2} x) \ldots (1 - \alpha^{i_v} x), \quad (EQ\ 2)$$

where $\sigma_0 = 1$.

The relationship between syndromes and error location polynomial is as follows (see also reference [1]):

$$\sum_{i=0}^{v} \sigma_i S_{j-i} = 0, \, j = v, \ldots, 2t-1. \quad (EQ\ 3)$$

In other words, the error location polynomial, $\sigma(x)$, generates the syndromes, $S_0, \ldots, S_{2t-1}$, and the error location polynomial, $\sigma(x)$, is the polynomial whose roots define the locations of those errors. The error location polynomial, $\sigma(x)$, can also be referred to as a linear feedback shift register (LFSR)-connection polynomial because of its particular characteristics.

Berlekamp Massey Algorithm (BMA)

We present the BMA modified as it is described within reference [3].

Let the syndromes, $S_0, \ldots, S_{2t-1}$, be defined in (EQ 1). Given $$\sigma^{(r)}(x) = \sum_{i=0}^{v_r} \sigma_i^{(r)} x^i \in GF(2^m)[x]. \quad (EQ\ 4)$$

where $v_r = \deg(\sigma^{(r)}(x))$, define the discrepancy $$\Delta_r = \sum_{i=0}^{v_r} \sigma_i^{(r)} S_{r-i}. \quad (EQ\ 5)$$

The procedures of BMA decoding processing can be stated as follows.

1) When r=0, initialize $\sigma^{(0)}(x)=1$, $B^{(0)}(x)=1$, $L_0=0$ and $P_0=0$ 2) Iteratively, conduct the following operations for r=1, ..., 2t−1

2.1) Compute $\Delta_{r-1}$ 2.2) Compute $$\delta_r = \begin{cases} 1 & \Delta_{r-1} \neq 0, 2L_{r-1} \leq r-1 \\ 0 & \text{otherwise} \end{cases} \quad (\text{EQ 6})$$

2.3) Compute $$L_r = \begin{cases} L_{r-1} & \delta_r = 0 \\ r - L_{r-1} & \delta_r = 1 \end{cases} \quad (\text{EQ 7})$$

2.4) Compute $$P_r = \begin{cases} P_{r-1} + 1 & \delta_r = 0 \\ 0 & \delta_r = 1 \end{cases} \quad (\text{EQ 8})$$

2.5) Compute $$\sigma^{(r)}(x) = \sigma^{(r-1)}(x) - \Delta_{r-1} x^{1+P_{r-1}} B^{(r-1)}(x) \quad (\text{EQ 9})$$

2.6) Compute $$B^{(r)}(x) = \begin{cases} B^{(r-1)}(x) & \delta_r = 0 \\ \Delta_{r-1}^{-1} \sigma^{(r-1)}(x) & \delta_r = 1 \end{cases} \quad (\text{EQ 10})$$

In the rest of this section, we present some properties of $\sigma^{(r)}(x)$, $B^{(r)}(x)$ and $L_r$.

Proposition 1 (see reference [3]) $\sigma^{(r)}(x)$ satisfies the following equations $$\sum_{i=0}^{v_r} \sigma_i^{(r)} S_{j-i} = \begin{cases} 0 & j = L_r, \ldots, r-1 \\ \Delta_r & j = r \end{cases} \quad (\text{EQ 11})$$

Proposition 2 (see reference [3]) $L_r$ is the shortest length of an LFSR that generates the syndromes, $S_0, \ldots, S_{r-1}$. Moreover, the sequence, $L_0, L_1, \ldots, L_{2t-1}$ is an increasing sequence.

Proposition 3 If the number of errors is $v \leq t$, then $L_{2t-1} = v$ and $\Delta_{2t-1}=0$.

Proof. By (EQ 3) and Proposition 2.

Proposition 4 If the number of errors is $v \leq t$, and suppose the error locations are as follows:

$$\alpha^{l_1}, \alpha^{l_2}, \ldots, \alpha^{l_v} \quad (\text{EQ 12})$$

Then, for k=1, ..., v, $\sigma^{(2t-1)}(\alpha^{l_k})=0$ but $B^{(2t-1)}(\alpha^{l_k}) \neq 0$.

Proof: Then $\sigma^{(2t-1)}(x)$ part of the proof can be found in reference [3]. Here, proof is given only for the last part of the proposition. Let $r_1, \ldots, r_s$ be the sequence $\{1, \ldots, 2t-1\}$ such that $\Delta_{r_k-1}=0$, k=1, ..., s, and when r∈$\{1, \ldots, 2t-1\}$/$\{r_1, \ldots, r_s\} \Delta_{r-1}=0$ and therefore $\delta_r=0$. Then from the BMA approach, the following equations can be derived:

$$\sigma^{(r_k)}(x) = \sigma^{(r_k-1)}(x) - \Delta_{r_k-1} x^{1+P_{r_k-1}} B^{(r_k-1)}(x) \quad (\text{EQ 13})$$

$$B^{(r_k)}(x) = \begin{cases} B^{(r_k-1)}(x) & \delta_{r_k} = 0 \\ \Delta_{r_k-1}^{-1} \sigma^{(r_k-1)}(x) & \delta_{r_k} = 1 \end{cases} \quad (\text{EQ 14})$$

where $r_0=r_1-1$. Moreover, by (EQ 10) and (EQ 11) of the BMA decoding processing approach, the following can be shown:

$$\sigma^{(2t-1)}(x)=\sigma^{(r_s)}(x) \text{ and } B^{(2t-1)}(x)=B^{(r_s)}(x).$$

Suppose there is $1 \leq j \leq s$ such that $B^{(2t-1)}(\alpha^{l_k})=0$, i.e., $B^{(r_s)}(\alpha^{l_j})=0$. Then, by (EQ 13) and (EQ 14), we have $\sigma^{(r_s-1)}(\alpha^{l_j})=0$ and $B^{(r_s-1)}(\alpha^{l_j})=0$. Iteratively, we have $\sigma^{(r_1)}(\alpha^{l_j})=0$ and $B^{(r_1)}(\alpha^{l_j})=0$. Since $\Delta_{r_1-1} \neq 0$, by (EQ 9) and (EQ 10), we have $$\sigma^{(r_1-1)}(\alpha^{l_j})=B^{(r_1-1)}(\alpha^{l_j})=0 \quad (\text{EQ 15})$$

Based on the assumption of $r_1, \ldots, r_s$, we have $\Delta_0 = \ldots = \Delta_{r_1-2}=0$. Then, by (EQ 16), (EQ 9) and (EQ 10), we have $\sigma^{(0)}(\alpha^{l_j})= \ldots =\sigma^{(r_1-1)}(\alpha^{l_j})=0$, which contradicts to $\sigma^{(0)}=1$, the initialization in the BMA approach. This proves the proposition.

Proposition 5 If the number of errors is $v \leq t$, and let $Q=1+P_{2t-1}-2(t-v)$ and $$\lambda(x)=B^{(2t-1)}(x) \quad ((\text{EQ 16})$$

Then $$\sum_{i=0}^{\deg(\lambda(x))} \lambda_i S_{j-i} = \begin{cases} 0 & j=v, \ldots, 2v-2 \\ 1 & j=2v-1 \end{cases} \quad (\text{EQ 17})$$

Proof: Let $0 \leq r \leq 2t-1$ such that $\Delta_{r-1} \neq 0$ but $\Delta_r = \Delta_{r+1} = \ldots = \Delta_{2t-1}=0$. Then $\delta_r = \delta_{r+1} = \ldots = \delta_{2t-1}=0$. Moreover, by the BMA decoding approach and Proposition 3 above, we have $L_r=v$.

Let m be the last number in $\{0, 1, \ldots, 2t-1\}$ such that $\delta_m=1$. Thus $\Delta_{m-1} \neq 0$ and $\delta_{m+1}= \ldots =\delta_{2t-1}=0$. Then by the definition of r, we have $r \geq m$, Moreover, by the BMA decoding approach, we have $$v=L_r=L_m=m-L_{m-1} \quad (\text{EQ 18})$$

$$P_{m+k}=k, k=0, \ldots, 2t-1-m \quad (\text{EQ 19})$$

and $$B^{(2t-1)}(x)=B^{(m)}(x)=\Delta_{m-1}^{-1}\sigma^{(m-1)}(x) \quad (\text{EQ 20})$$

Therefore, by Proposition 1

$$\sum_{i=0}^{} B_i^{(2t-1)} S_{j-i} = \begin{cases} 0 & j=L_{m-1}, \ldots, m-2 \\ 1 & j=m-1 \end{cases} \quad (\text{EQ 21})$$

Since $\lambda(x)=x^Q B^{(2t-1)}(x)$, we have $\lambda_0 = \ldots =\lambda_{Q-1}=0$ and $\lambda_{Q+k}=B_k^{(2t-1)}$, k=0, , , .deg($B^{(2t-1)}$). Thus $$\sum_{i=0}^{\deg(\lambda)} \lambda_i S_{j-i} = \sum_{k=0}^{} B_k^{(2t-1)} S_{j-Q-k} = \begin{cases} 0 & j-Q=L_{m-1}, \ldots, m-2 \\ 1 & j-Q=m-1 \end{cases} \quad (\text{EQ 22})$$

Since $P_{2t-1}=2t-1-m$ by (EQ 10), we have $Q=1+2t-1-m-2t+2v=2v-m$. By this conclusion and (EQ 18), $j-Q=L_{m-1}$ implies $j=v$ and $j-Q=m-1$ implies $j=2v-1$. Therefore, (EQ 22) is (EQ 17).

Classical Error Evaluator: Forney's Formula

Let $\sigma(x)$ be the error location polynomial with $\deg(\sigma(x))=v\leq t$. Compute the following:

$$\omega(x) = \sigma(x)\left(\sum_{j=0}^{2t-1} S_j x^j\right) \mod(x^{2t}) \quad \text{(EQ 23)}$$

which is $$\omega(x) = \sigma\left(\sum_{i=1}^{v-1} x^i\left(\sum_{k=0}^{v} \sigma_k S_{i-k}\right)\right) \quad \text{(EQ 24)}$$

Then the error values (e.g., the error magnitudes) can be computed as follows:

$$e_i = \left(\frac{\omega(\alpha^{-i})}{\alpha^{-i}\sigma'(\alpha^{-i})}\right) \quad \text{(EQ 25)}$$

where $$\alpha^{-i}\sigma'(\alpha^{-i}) = \alpha^{-i}\frac{\partial\sigma}{\partial x}\bigg|_{x=\alpha^{-i}}$$

can be obtained from the odd parts of the Chien search.

New Error Evaluator (Obviates Need for Error Value Polynomial (EVP))

Let $\sigma(x)=\sigma^{(2t-1)}(x)$, $B^{(2t-1)}(x)$ and $P_{(2t-1)}$ be obtained from the BMA decoding approach and suppose $\deg(\sigma(x))=v\leq t$. Define $$\lambda(x)=x^Q B^{(2t-1)}(x) \quad \text{(EQ 26)}$$

where $Q=1+P_{(2t-1)}-2(t-v)$.

Theorem 1 Then the error value, $e_i$, can be computed by $$e_i = \left(\frac{1}{\alpha^{(2v-1)i}\lambda(\alpha^{-i})[\alpha^{-i}\sigma'(\alpha^{-i})]}\right) \quad \text{(EQ 27)}$$

Proof: Let i be an error location (i.e., $\sigma(\alpha^{-i})=0$) and error value, $e_i$, its error value. Modify this error value, $e_i$, to be as follows:

$$E_i = e_i\alpha^{iv}\lambda(\alpha^{-i}) = e_i\alpha^{iv}\sum_{j=0}^{v}\lambda_j\alpha^{-ij} \quad \text{(EQ 28)}$$

Then by Proposition 5 the modified error vector $E=(\ldots, e_i\alpha^{iv}\lambda(\alpha^{-i}), \ldots)$ has the same error locations as the original error vector, i.e., $\sigma(x)$ is also the error locator polynomial of E. Let $T_j$ be syndrome of the modified error vector E. Thus, by (EQ 3), we have $$\sum_{k=0}^{v}\sigma_k T_{i-k} = 0, \; j=v,\ldots,2t-1. \quad \text{(EQ 29)}$$

Moreover, $$T_j = \sum_{i=0}^{n-1} E_i\alpha^{i(L+j)} = \sum_{i=0}^{n-1}\left(e_i\alpha^{iv}\sum_{l=0}^{v}\lambda_l\alpha^{-il}\right)\alpha^{i(L+j)} \quad \text{(EQ 30)}$$

$$T_j = \sum_{l=0}^{v}\lambda_l\left(\sum_{i=0}^{n-1}e_i\alpha^{i(L+v+j-l)}\right) = \sum_{l=0}^{v}\lambda_l S_{v+j-l} \quad \text{(EQ 31)}$$

Then by (EQ 17) of Proposition 5, we have $T_i=0$, $i=1,\ldots,v-2$ but $T_{v-1}=1$. With this conclusion and (EQ 29), the following is shown:

$$\Omega(x) = \sigma(x)\left(\sum_{j=1}^{v-1} T_j x^j\right)\mod(x^{2t}) = \sum_{i=1}^{2t-1} x^i\left(\sum_{k=0}^{v}\sigma_k T_{i-k}\right) = x^{v-1} \quad \text{(EQ 32)}$$

By Forney's formula provide above, we have $$E_i = \left(\frac{\alpha^{-i(v-1)}}{\alpha^{-i}\sigma'(\alpha^{-i})}\right).$$

Thus

The new error evaluator is as follows:

$$e_i = \left(\frac{E_i}{\alpha^{iv}\sigma'(\alpha^{-i})}\right) = \left(\frac{\alpha^{-i(v-1)}}{\alpha^{i(v-1)}\lambda(\alpha^{-i})\sigma'(\alpha^{-i})}\right) = \left(\frac{1}{\alpha^{2(v-1)i}\lambda(\alpha^{-i})\sigma'(\alpha^{-i})}\right) \quad \text{(EQ 33)}$$

Figure 9:
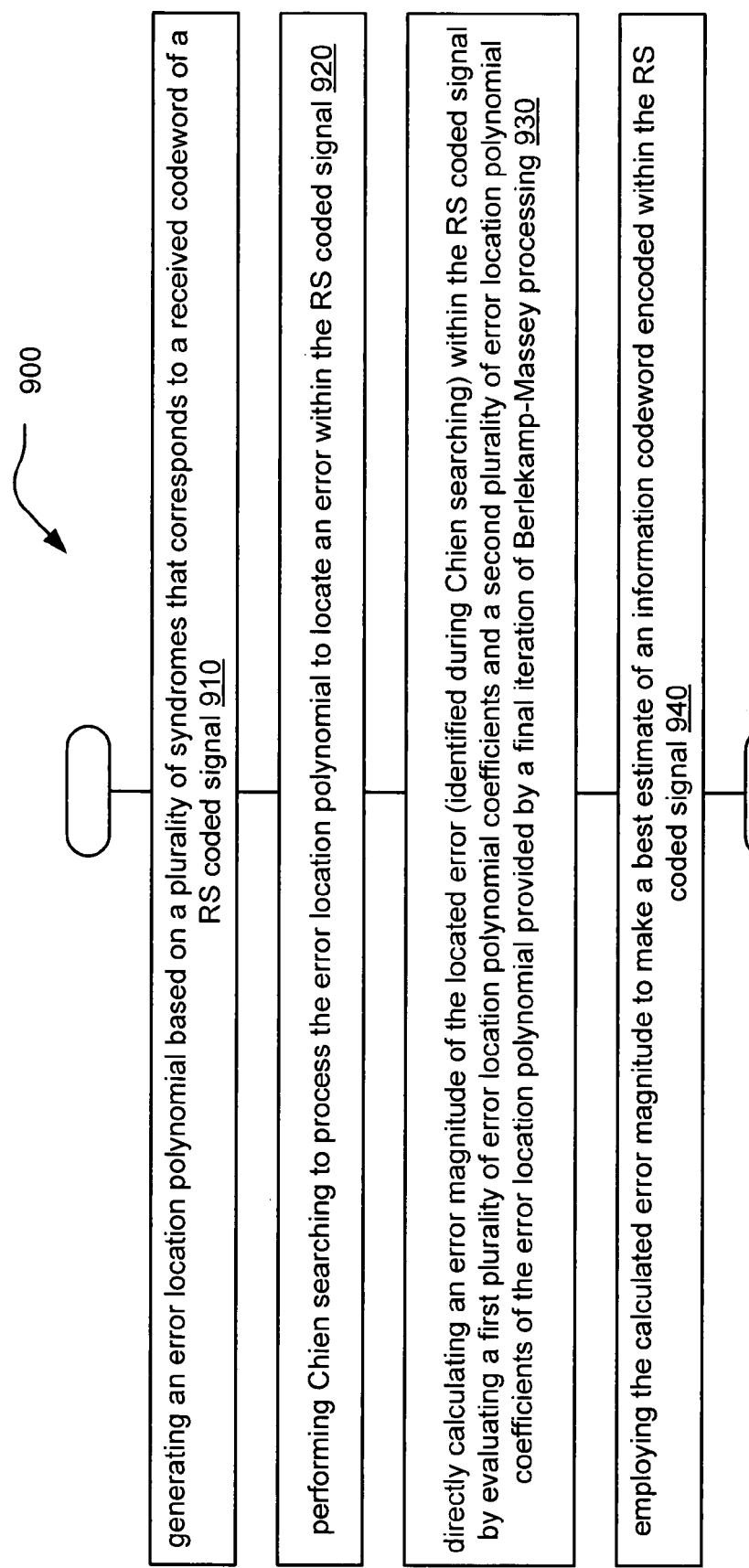
FIG. 9 illustrates an embodiment of a method that is operable to perform decoding of a RS coded signal.

FIG. 9 illustrates an embodiment of a method that is operable to perform decoding of a RS coded signal. As shown in a block 910, the method 900 operates by generating an error location polynomial based on a plurality of syndromes that corresponds to a received codeword of the RS coded signal. In some embodiments, the method 900 could alternatively include performing any pre-processing of a continuous-time signal that has been received from a communication channel, including, though not limited to, frequency converting (e.g., down-converting), analog filtering, digital sampling, digital filtering, gain control, demodulation, symbol mapping, and/or any other pre-processing operations required in a particular embodiment to extract a received codeword from RS coded signal. Moreover, in some embodiments, the method 900 may also include performing syndrome calculation processing to generate the plurality of syndromes that corresponds to a received codeword of the RS coded signal.

As shown in a block 920, the method 900 includes performing Chien searching to process the error location polynomial to locate an error within the RS coded signal. Thereafter, the method 900 continues by directly calculating an error magnitude of the located error (identified during Chien searching) within the RS coded signal by evaluating a first plurality of error location polynomial coefficients and a second plurality of error location polynomial coefficients of the error location polynomial provided by a final iteration of Berlekamp-Massey processing, as shown in a block 930. As can be seen, the need to perform generation of the error value polynomial (EVP) is obviated by the ability to calculate any error magnitudes (e.g., any error values) directly. The method 900 then continues by employing the calculated error magnitude to make a best estimate of an information codeword encoded within the RS coded signal, as shown in a block 940.

It is also noted that the specific variant of the Berlekamp-Massey algorithm (BMA) decoding approach may change in alternative embodiments. This might cause minor modifications to the error value equation employed herein, yet the principles presented herein can also be applied to those embodiments to allow for direct calculation of error magnitudes (e.g., error values) without requiring the need to calculate the EVP. These variants may include, but are not limited to the following:

(1) computing the discrepancy at the beginning of the decoding rather than the end;

(2) calculating sigma ($\sigma(x)$) by multiplying with the $x^{(r-u)}$ rather than shifting sigma-p ($\sigma_p$);

(3) performing the Chien search from the first data symbol until the last ECC parity symbol rather than the vice verse; and (4) storing lambda ($\lambda$) rather than sigma-p ($\sigma_p$) and Delta-p ($\Delta_p$) delta-P as described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] R. Koetter, "On the determination of error values for codes from a class of maximal curves," *Proceedings Allerton Conference on Communication, Control, and Computing*, University of Illinois at Urbana-Champaign, 1997.

[2] R. E. Blahut, *Theory and Practice of Error Control Codes*, Addison-Wesley Publishing Company, 1983.

[3] J. L. Massey, "Shift-register synthesis and BCH decoding," IEEE, Vol. IT-15, No. 1, pp. 122-127, January 1969.

What is claimed is:

1. A decoder that is operable to decode a Reed-Solomon (RS) coded signal, the decoder comprising:
an error locator polynomial generation module that is operable to generate an error location polynomial based on a plurality of syndromes that corresponds to a received codeword of the RS coded signal; and
a combined error location search and error magnitude calculation module that is operable to:
locate an error within the RS coded signal using the error location polynomial; and
directly calculate an error magnitude of the located error within the RS coded signal using a first plurality of error location polynomial coefficients and a second plurality of error location polynomial coefficients; and wherein:
the decoder is operable to employ the calculated error magnitude to make a best estimate of an information bit encoded within the RS coded signal.

2. The decoder of claim 1, wherein:
the first plurality of error location polynomial coefficients is a previous plurality of error location polynomial coefficients corresponding to a previous iteration; and
the second plurality of error location polynomial coefficients is a current plurality of odd error location polynomial coefficients corresponding to a current iteration.

3. The decoder of claim 1, further comprising:
an error correction module that corrects the error within the RS coded signal based on the calculated error magnitude; and wherein:
the decoder is operable to employ the corrected error to make the best estimate of the information bit encoded within the RS coded signal.

4. The decoder of claim 1, further comprising:
a first plurality of registers and a second plurality of registers for use in storing error location polynomial coefficients that include the first plurality of error location polynomial coefficients and the second plurality of error location polynomial coefficients.

5. The decoder of claim 1, further comprising:
a first plurality of registers and a second plurality of registers for use in storing error location polynomial coefficients; and wherein:
during an iteration of a plurality of iterations, the combined error location search and error magnitude calculation module is operable to:
retrieve the first plurality of error location polynomial coefficients from the first plurality of registers;
retrieve the second plurality of error location polynomial coefficients from the second plurality of registers; and
employ the first plurality of error location polynomial coefficients and the second plurality of error location polynomial coefficients for use in evaluating the error location polynomial at an error location.

6. The decoder of claim 1, further comprising:
a syndrome calculation module that is operable to process the received codeword of the RS coded signal to generate the plurality of syndromes.

7. The decoder of claim 1, wherein:
the first plurality of registers includes n registers, where n is an integer; and
the second plurality of registers also includes n registers.

8. The decoder of claim 1, wherein:
the decoder is implemented within a communication device; and
the communication device is implemented within at least one of a satellite communication system, a wireless communication system, a wired communication system, and a fiber-optic communication system.

9. The decoder of claim 1, wherein:
the RS coded signal is received from a communication channel.

10. The decoder of claim 1, wherein:
the RS coded signal is read from a storage media of a hard disk drive (HDD).

11. A decoder that is operable to decode a Reed-Solomon (RS) coded signal, comprising:
a first plurality of registers and a second plurality of registers for use in storing error location polynomial coefficients;
an error locator polynomial generation module that is operable to generate an error location polynomial based on a plurality of syndromes that corresponds to a received codeword of the RS coded signal; and
a combined error location search and error magnitude calculation module that is operable to:
retrieve from the first plurality of registers a first plurality of error location polynomial coefficients of the error location polynomial corresponding to a previous iteration;
retrieve from the second plurality of registers a second plurality of error location polynomial coefficients of the error location polynomial corresponding to a current iteration;
perform Chien searching to process the error location polynomial including the first plurality of error location polynomial coefficients of the error location polynomial and the second plurality of error location polynomial coefficients of the error location polynomial to locate an error within the RS coded signal; and
directly calculate an error magnitude of the located error within the RS coded signal using a third plurality of error location polynomial coefficients corresponding to a final iteration and a fourth plurality of error location polynomial coefficients corresponding to an iteration just before the final iteration that are calculated during the Chien searching; and wherein:
the decoder is operable to employ the calculated error magnitude to make a best estimate of an information bit encoded within the RS coded signal.

12. The decoder of claim 11, wherein:
the final iteration is the current iteration;
the iteration just before the final iteration is the previous iteration;
the first plurality of error location polynomial coefficients is the third plurality of error location polynomial coefficients; and
the second plurality of error location polynomial coefficients is the fourth plurality of error location polynomial coefficients.

13. The decoder of claim 11, wherein:
the first plurality of registers includes n registers, where n is an integer; and
the second plurality of registers also includes n registers.

14. The decoder of claim 11, wherein:
the decoder is implemented within a communication device; and
the communication device is implemented within at least one of a satellite communication system, a wireless communication system, a wired communication system, and a fiber-optic communication system.

15. The decoder of claim 11, wherein:
the RS coded signal is received from a communication channel.

16. The decoder of claim 11, wherein:
the RS coded signal is read from a storage media of a hard disk drive (HDD).

17. A method that is operable to employ perform decoding of a Reed-Solomon (RS) coded signal, the method comprising:
generating an error location polynomial based on a plurality of syndromes that corresponds to a received codeword of the RS coded signal;
performing Chien searching to process the error location polynomial to locate an error within the RS coded signal;
directly calculating an error magnitude of the located error within the RS coded signal using a first plurality of error location polynomial coefficients of the error location polynomial corresponding to a final iteration of Berlekamp-Massey processing and a second plurality of error location polynomial coefficients of the error location polynomial corresponding to an iteration just before the final iteration of Berlekamp-Massey processing that are calculated during the Chien searching; and
employing the calculated error magnitude to make a best estimate of an information bit encoded within the RS coded signal.

18. The method of claim 17, further comprising:
retrieving from a first plurality of registers the first plurality of error location polynomial coefficients of the error location polynomial corresponding to the final iteration of Berlekamp-Massey processing; and
retrieving from a second plurality of registers the second plurality of error location polynomial coefficients of the error location polynomial corresponding to an iteration just before the final iteration of Berlekamp-Massey processing; and wherein:
the first plurality of registers includes n registers, where n is an integer; and
the second plurality of registers also includes n registers.

19. The method of claim 17, wherein:
the method is performed within a decoder;
the decoder is implemented within a communication device; and
the communication device is implemented within at least one of a satellite communication system, a wireless communication system, a wired communication system, and a fiber-optic communication system.

20. The method of claim 17, further comprising:
reading the RS coded signal from a storage media of a hard disk drive (HDD).

* * * * *